(12) United States Patent
Rouh et al.

(10) Patent No.: US 8,470,664 B2
(45) Date of Patent: Jun. 25, 2013

(54) METHODS OF FABRICATING A DUAL POLYSILICON GATE AND METHODS OF FABRICATING A SEMICONDUCTOR DEVICE USING THE SAME

(75) Inventors: Kyong Bong Rouh, Seoul (KR); Yong Seok Eun, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/365,462

(22) Filed: Feb. 3, 2012

(65) Prior Publication Data
US 2012/0208334 A1 Aug. 16, 2012

(30) Foreign Application Priority Data
Feb. 15, 2011 (KR) .................. 10-2011-0013475

(51) Int. Cl.
*H01L 31/8238* (2006.01)
*H01L 21/84* (2006.01)
*H01L 21/8234* (2006.01)

(52) U.S. Cl.
USPC ........... 438/231; 438/163; 438/197; 438/199; 438/229; 438/230; 438/157; 257/E21.623; 257/E21.624; 257/E21.635; 257/E21.637; 257/E21.638

(58) Field of Classification Search
USPC ................... 257/E21.623, E21.624, E21.635, 257/E21.637, E21.638; 438/157, 163, 197, 438/199, 217, 229, 230, 231, 275, 276, 286, 438/289–291, 299–307, 514, 176, 195, 267, 438/283, 184, 585, 587, 588, 595, 596
See application file for complete search history.

(56) References Cited

U.S. PATENT DOCUMENTS

| 3,906,620 | A  | * | 9/1975  | Anzai et al. .............. 438/287 |
| 4,074,300 | A  | * | 2/1978  | Sakai et al. .............. 257/387 |
| 4,558,338 | A  | * | 12/1985 | Sakata .................... 257/387 |
| 6,008,100 | A  | * | 12/1999 | Yeh et al. ................ 438/305 |
| 6,475,841 | B1 | * | 11/2002 | Taylor et al. ............ 438/197 |
| 7,056,799 | B2 | * | 6/2006  | Phua et al. .............. 438/303 |
| 2003/0235943 | A1 | * | 12/2003 | Trivedi .................. 438/197 |
| 2004/0180483 | A1 | * | 9/2004  | Park et al. .............. 438/197 |
| 2006/0177983 | A1 | * | 8/2006  | Trivedi .................. 438/270 |
| 2007/0032007 | A1 | * | 2/2007  | Hirase et al. ............ 438/197 |

(Continued)

FOREIGN PATENT DOCUMENTS

| KR | 1020040059931 A | 7/2004 |
| KR | 1020040074349 A | 8/2004 |
| KR | 1020060010465 A | 2/2006 |

*Primary Examiner* — Chuong A Luu
*Assistant Examiner* — Cory Eskridge
(74) *Attorney, Agent, or Firm* — William Park & Associates Patent Ltd.

(57) ABSTRACT

A dual polysilicon gate is fabricated by, inter alia, forming a polysilicon layer doped with impurities of a first conductivity type on a substrate having a first region and a second region, forming a mask pattern that covers the polysilicon layer in the first region and leaves the polysilicon layer in the second region, injecting impurities of a second conductivity type into the polysilicon layer in the second region left exposed by the mask pattern. Removing the mask pattern, and patterning the polysilicon layer to form a first polysilicon pattern in the first region and a second polysilicon pattern in the second region. The second polysilicon pattern is formed to have protrusions that laterally protrude from sidewalls thereof. Subsequently, impurities of the second conductivity type are injected into the substrate in the second region and into the protrusions of the second polysilicon pattern.

20 Claims, 6 Drawing Sheets

U.S. PATENT DOCUMENTS

2007/0096212 A1* 5/2007 Sato et al. .................. 257/350
2007/0096217 A1* 5/2007 Lee et al. .................. 257/369
2009/0057771 A1* 3/2009 Fukasaku .................. 257/369
2011/0171794 A1* 7/2011 Seo et al. .................. 438/231

* cited by examiner

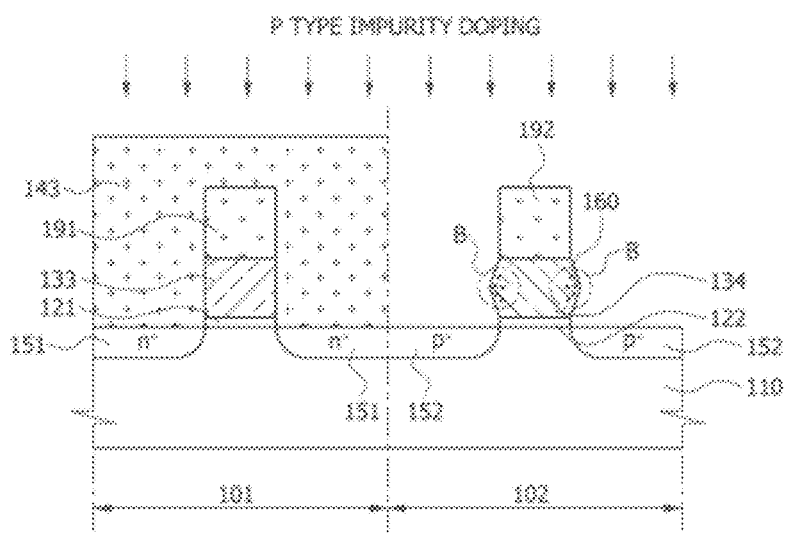
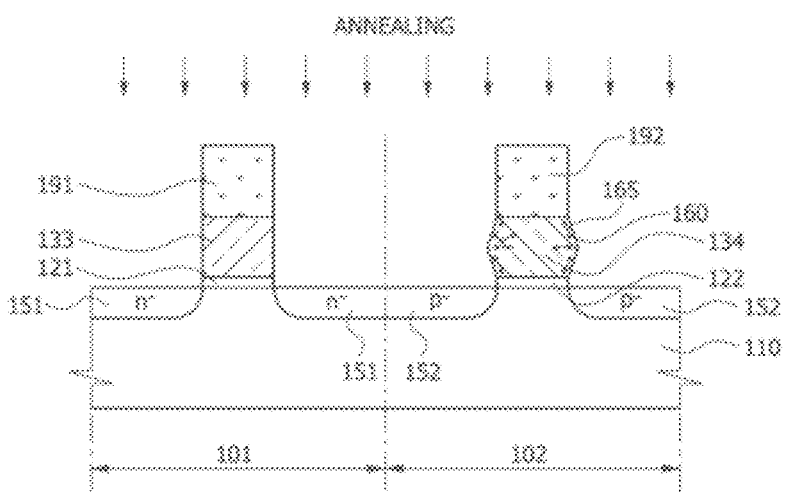

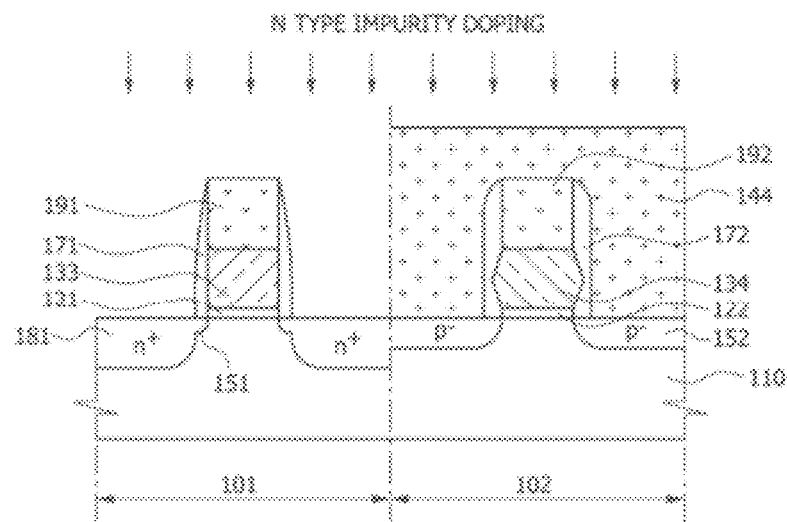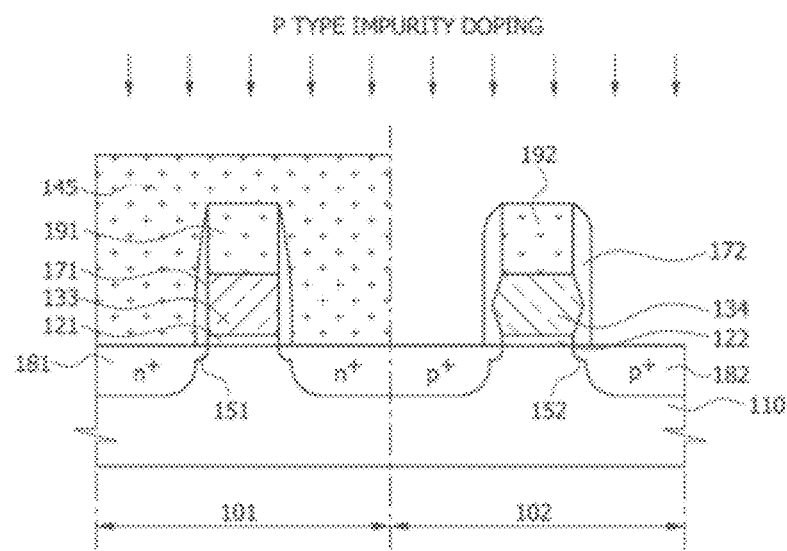

METHODS OF FABRICATING A DUAL POLYSILICON GATE AND METHODS OF FABRICATING A SEMICONDUCTOR DEVICE USING THE SAME

CROSS-REFERENCES TO RELATED APPLICATIONS

The present application claims priority under 35 U.S.C 119(a) to Korean Application No. 10-2011-0013475, filed on Feb. 15, 2011, in the Korean intellectual property Office, which is incorporated herein by reference in its entirety.

BACKGROUND

1. Technical Field

Example embodiments of the present disclosure relate to methods of fabricating a semiconductor device and, more particularly, to methods of fabricating a dual polysilicon gate and methods of a semiconductor device using the same.

2. Related Art

Recently, complementary metal-oxide-semiconductor (CMOS) circuits have been widely used to reduce power consumption of semiconductor devices. CMOS circuits typically include N-channel MOS (NMOS) transistors and P-channel MOS (PMOS) transistors which are disposed in and/or on the same substrate. In general, PMOS transistors may have a buried channel structure. As CMOS circuits become more highly integrated, channel lengths of the PMOS transistors have been gradually reduced. In the event that the PMOS transistors have a buried channel structure, the PMOS transistors may suffer greatly from a short channel effect which leads to a channel leakage current. Thus, a dual polysilicon gate structure has been proposed to realize a PMOS transistor having a surface channel structure. The dual polysilicon gate structure may include an N-type polysilicon pattern doped with N-type impurities and a P-type polysilicon pattern doped with P-type impurities. The P-type polysilicon pattern may be used as a gate of the PMOS transistor, and the N-type polysilicon pattern may be used as a gate of the NMOS transistor.

To form the dual polysilicon gate structure, a gate insulation layer may be formed on a substrate having an NMOS transistor region and a PMOS transistor region, and a polysilicon layer may be formed on the gate insulation layer. The polysilicon layer may be doped with impurities of a first conductivity type, for example, N-type impurities during or after formation of the polysilicon layer. A mask pattern may be then formed to expose the PMOS transistor region and to cover the NMOS transistor region, and impurities of a second conductivity type may be injected into the polysilicon layer of the first conductivity type in the PMOS transistor region using the mask pattern as an implantation mask. Thus, the polysilicon layer of the first conductivity type in the PMOS transistor region may be converted into a polysilicon layer of a second conductivity type, for example, a P-type polysilicon layer. If an impurity concentration of the N-type polysilicon layer is too high, it may be difficult to convert the N-type polysilicon layer in the PMOS transistor region into a P-type polysilicon layer using the counter doping process. In contrast, if the impurity concentration of the N-type polysilicon layer is too low, the N-type polysilicon layer in the PMOS transistor region may be more readily converted into a P-type polysilicon layer using the counter doping process. When the impurity concentration of the N-type polysilicon layer is too low, however, electrical characteristics of the N-type polysilicon layer in the NMOS transistor region may be degraded.

To solve the above disadvantages, an intrinsic polysilicon layer may be formed on a substrate having an NMOS transistor region and a PMOS transistor region. Subsequently, N-type impurities may be selectively injected into the intrinsic polysilicon layer in the NMOS transistor region, and P-type impurities may be selectively injected into the intrinsic polysilicon layer in the PMOS transistor region. However, in this case, two different mask patterns, for example, first and second mask patterns may be required to form the dual polysilicon gate structure. The first mask pattern may be formed to selectively expose the NMOS transistor region using a first photo mask, and the second mask pattern may be formed to selectively expose the PMOS transistor region using a second photo mask. That is, two separate photo masks may be required which may lead to an increase in fabrication costs of the CMOS circuits. Further, additional processes, for example, first and second photoresist strip processes for removing the first and second mask patterns may be required. Moreover, first and second cleaning processes for removing residues of the first and second mask patterns may also be required. Consequently, the number of total process steps may be increased.

SUMMARY

Example embodiments are directed to methods of fabricating a dual polysilicon gate and methods of a semiconductor device using the same.

According to some embodiments, a method of fabricating a dual polysilicon gate includes forming a polysilicon layer doped with impurities of a first conductivity type on a substrate having a first region and a second region, forming a mask pattern that covers the polysilicon layer in the first region and leaves the polysilicon layer in the second region exposed, injecting impurities of a second conductivity type into the polysilicon layer in the second region left exposed by the mask pattern, removing the mask pattern, and patterning the polysilicon layer to form a first polysilicon pattern in the first region and a second polysilicon pattern in the second region. The second polysilicon pattern is formed to have protrusions that laterally protrude from sidewalls thereof. Subsequently, impurities of the second conductivity type are injected into the substrate in the second region to form lightly doped regions and into the protrusions of the second polysilicon pattern to dope the protrusions with the impurities of the second conductivity type.

The first region may be an NMOS transistor region and the second region may be a PMOS transistor region.

The first conductivity type may be an N-type and the second conductivity type may be a P-type.

The polysilicon layer doped with the impurities of the first conductivity type may be formed by simultaneously supplying process source gases for depositing a polysilicon layer and supplying an impurity source gas of the first conductivity type for doping the polysilicon layer into a process chamber.

The protrusions of the second polysilicon pattern may formed to laterally extend from intermediate sidewall portions between upper sidewall portions and lower sidewall portions of the second polysilicon pattern. Forming the second polysilicon pattern may include forming a hard mask pattern on the polysilicon layer and partially etching the polysilicon layer using a first etching process that employs the hard mask pattern as an etch mask. Thus, upper sidewalls having a positive sloped profile may be formed. Subsequently, the remaining polysilicon layer may be etched using a second etching process different from the first etching process, thereby forming lower sidewalls having a negative sloped profile. A width of an upper portion of the second polysilicon pattern may gradually increase toward the substrate, and a width of a lower portion of the second polysilicon pattern may gradually decrease toward the substrate.

Doping the protrusions with the impurities of the second conductivity type may be performed using a tilted ion implantation process.

The method may further include applying a thermal treatment process to the substrate including the lightly doped regions. The thermal treatment process may be performed using a rapid thermal process (RTP), and the rapid thermal process may be performed using a nitrogen gas as an ambient gas for 20 minutes or less. Alternatively, the rapid thermal process may be performed using a mixture of a nitrogen gas and an oxygen gas as an ambient gas for 20 minutes or the less.

According to further embodiments, a method of fabricating a semiconductor device includes forming a polysilicon layer doped with impurities of a first conductivity type on a substrate having a first region and a second region, forming a mask pattern that covers the polysilicon layer in the first region and leaves the polysilicon layer in the second region exposed, injecting impurities of a second conductivity type into the polysilicon layer in the second region left exposed by the mask pattern, removing the mask pattern, and patterning the polysilicon layer to form a first polysilicon pattern in the first region and a second polysilicon pattern in the second region. The second polysilicon pattern is formed to have protrusions that laterally protrude from sidewalls thereof. Subsequently, impurities of the first conductivity type are injected into the substrate in the first region to form first lightly doped regions. Impurities of the second conductivity type are injected into the substrate in the second region to form second lightly doped regions and into the protrusions of the second polysilicon pattern to dope the protrusions with the impurities of the second conductivity type. A first spacer and a second spacer are then formed on sidewalls of the first polysilicon pattern and on sidewalls of the second polysilicon pattern, respectively. Impurities of the first conductivity type are injected into the substrate in the first region to form first source/drain regions, and impurities of the second conductivity type are injected into the substrate in the second region to form second source/drain regions.

The first and second regions may be an NMOS transistor region and a PMOS transistor region, respectively.

The first conductivity type may be an N-type and the second conductivity type may be a P-type.

The polysilicon layer doped with the impurities of the first conductivity type may be formed using an in-situ doping process, and the in-situ doping process may be performed by simultaneously supplying process source gases for depositing a polysilicon layer and supplying an impurity source gas of the first conductivity type for doping the polysilicon layer into a process chamber.

The protrusions of the second polysilicon pattern may be formed to laterally extend from intermediate sidewall portions between upper sidewall portions and lower sidewall portions of the second polysilicon pattern. Forming the second polysilicon pattern may include forming a hard mask pattern on the polysilicon layer and partially etching the polysilicon layer using a first etching process that employs the hard mask pattern as an etch mask. Thus, upper sidewalls having a positive sloped profile may be formed. Subsequently, the remaining polysilicon layer may be etched using a second etching process different from the first etching process, thereby forming lower sidewalls having a negative sloped profile. That is, a width of an upper portion of the second polysilicon pattern may gradually increase as the polysilicon layer gets closer to the substrate, and a width of a lower portion of the second polysilicon pattern may gradually decrease as the polysilicon layer gets closer the substrate.

Doping the protrusions with the impurities of the second conductivity type may be performed using a tilted ion implantation process.

The method may further include applying a thermal treatment process to the substrate including the second lightly doped regions. The thermal treatment process may be performed using a rapid thermal process (RTP), and the rapid thermal process may be performed using a nitrogen gas as an ambient gas for 20 minutes or the less. Alternatively, the rapid thermal process may be performed using a mixture of a nitrogen gas and an oxygen gas as an ambient gas for 20 minutes or the less.

BRIEF DESCRIPTION OF THE DRAWINGS

The above and other features and advantages of the disclosure will become more apparent in view of the attached drawings and accompanying detailed description.

FIGS. 1 to 8 depict cross sectional views illustrating a method of fabricating a dual polysilicon gate according to embodiments and a method of fabricating a semiconductor device using the same.

DESCRIPTION OF SPECIFIC EMBODIMENTS

Figure 1:
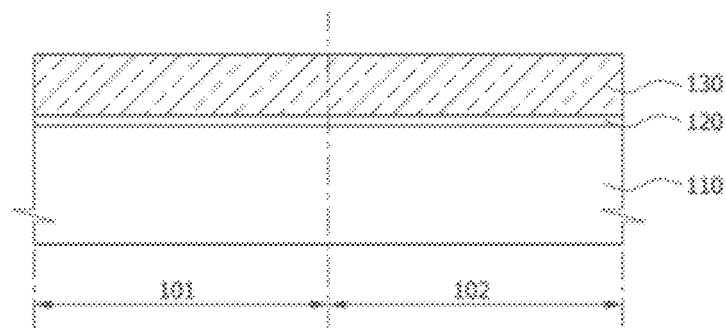

Embodiments will be described more fully hereinafter with reference to the accompanying drawings. Many different forms and embodiments are possible without deviating from the spirit and teachings of this disclosure and so the disclosure should not be construed as limited to the embodiments set forth herein. Rather, these example embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

As used herein the term "and/or" includes any and all combinations of one or more of the associated listed items.

FIGS. 1 to 8 depict cross sectional views illustrating a method of fabricating a dual polysilicon gate according to example embodiments and a method of fabricating a semiconductor device using the same.

Referring to FIG. 1, a gate insulation layer 120 and a polysilicon layer 130 may be sequentially formed on a substrate 110 having a first region 101 and a second region 102. The first region 101 may correspond to an NMOS transistor region in which NMOS transistors are formed, and the second region may correspond to a PMOS transistor region in which PMOS transistors are formed. The substrate 110 may be a silicon substrate, but the substrate 110 is not limited to the silicon substrate. For example, the substrate 110 may be a silicon-on-insulator (SOI) substrate. The gate insulation layer 120 may be formed of a silicon oxide layer. The polysilicon layer 130 may be formed using a chemical vapor deposition (CVD) process. When the polysilicon layer 130 is formed using a chemical vapor deposition (CVD) process, the polysilicon layer 130 may be formed using an in-situ doping technique. That is, the polysilicon layer 130 may be formed by simultaneously supplying process source gases into a process chamber for depositing a polysilicon layer and an N-type impurity source gas for doping the polysilicon layer. Consequently, the polysilicon layer 130 may be formed to have an N-type. While the polysilicon layer 130 is formed, the N-type impurity source gas may be sufficiently supplied to obtain an excellent characteristic of NMOS transistors.

Figure 2:
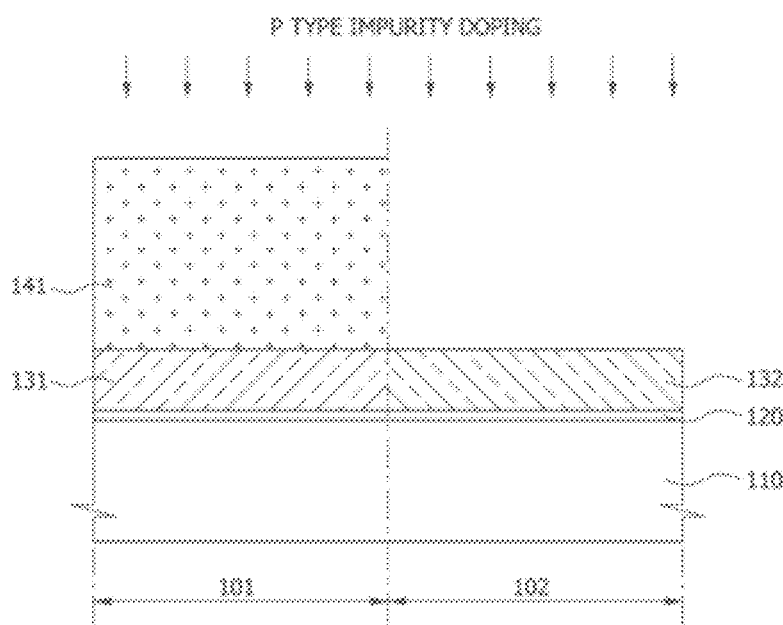

Referring to FIG. 2, a first mask pattern 141 may be formed on the polysilicon layer 130. The first mask pattern 141 may be formed to cover the polysilicon layer (130 of FIG. 1) in the first region 101 and to leave the polysilicon layer (130 of FIG. 1) exposed in the second region 102. The first mask pattern 141 may be formed of a photoresist pattern. The first mask pattern 141 may be formed using an exposure process utilizing a photo mask and a development process utilizing a developer. As indicated by arrows in FIG. 2, P-type impurities may be then injected into the polysilicon layer (130 of FIG. 1) in the second region 102 using the first mask pattern 141 as an impurity mask. Accordingly, the N-type polysilicon layer (130 of FIG. 1) in the first region 101 may still maintain an N-type such that the first region 101 may be an N-type polysilicon layer 131 (also referred to as a first polysilicon layer hereinafter), and the N-type polysilicon layer (130 of FIG. 1) in the second region 102 may be counter-doped to form a P-type polysilicon layer 132 (also referred to as a second polysilicon layer hereinafter). Subsequently, the first mask pattern 141 may be removed after the P-type impurities are injected.

As described with reference to FIG. 1, during formation of the polysilicon layer 130, the N-type impurity source gas may be sufficiently supplied into the process chamber. Thus, the polysilicon layer 130 may be heavily doped with the N-type impurities such that the polysilicon layer 130 may have a high impurity concentration. Accordingly, even though P-type impurities are injected into the N-type polysilicon layer 130 in the second region 102, the N-type polysilicon layer 130 in the second region 102 may not be sufficiently counter-doped with P-type impurities. If the N-type polysilicon layer 130 in the second region 102 is not sufficiently counter-doped, characteristics of PMOS transistors may be significantly degraded. If, on the other hand, a high dose of P-type impurities are injected into the N-type polysilicon layer 130 in the second region 102, the N-type polysilicon layer 130 in the second region 102 may be sufficiently counter-doped. However, in this case, a part of the P-type impurities may be injected into the substrate 110 through the gate insulation layer 120. Thus, there may be limitations as to how much the dose of the P-type impurities may be increased. Thus, when a high dose of P-type impurities is injected into the N-type polysilicon layer 130 in the second region 102, there may be limitations as to the amount the concentration of the P-type impurities may be increased when counter-doping the polysilicon layer 130 located in the second region 102.

Figure 3:
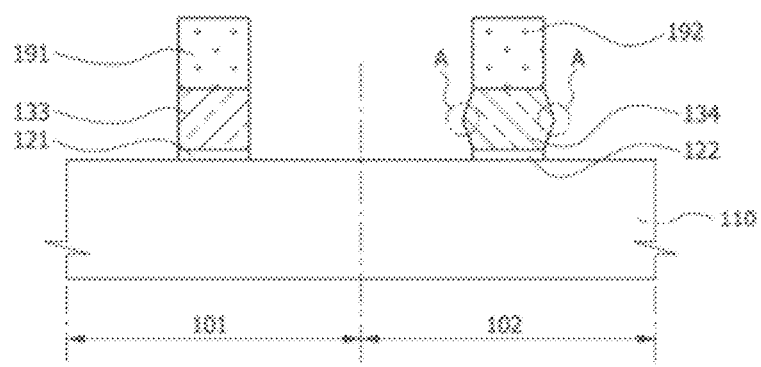

Referring to FIG. 3, a first hard mask pattern 191 and a second hard mask pattern 192 may be formed on the first polysilicon layer (131 of FIG. 2) in the first region 101 and on the second polysilicon layer (132 of FIG. 2) in the second region 102, respectively. The first and second polysilicon layers 131 and 132 may be etched using the first and second hard mask patterns 191 and 192 as etch masks, thereby forming an N-type polysilicon pattern or layer 133 over the substrate 110 in the first region 101 and a P-type polysilicon pattern or layer 134 over the substrate 110 in the second region 102. The gate insulation layer (120 of FIG. 2) may also be etched during formation of the N-type polysilicon pattern 133 and the P-type polysilicon pattern 134. In this case, a first gate insulation pattern 121 may be formed between the substrate 110 and the N-type polysilicon pattern 133, and a second gate insulation pattern 122 may be formed between the substrate 110 and the P-type polysilicon pattern 134. The P-type polysilicon pattern 134 may be formed to have protrusions A that laterally protrude from both sidewalls thereof.

A process for forming the N-type polysilicon pattern 133 and the P-type polysilicon pattern 134 will be described more fully hereinafter with reference to FIGS. 9 to 11.

Figure 9:
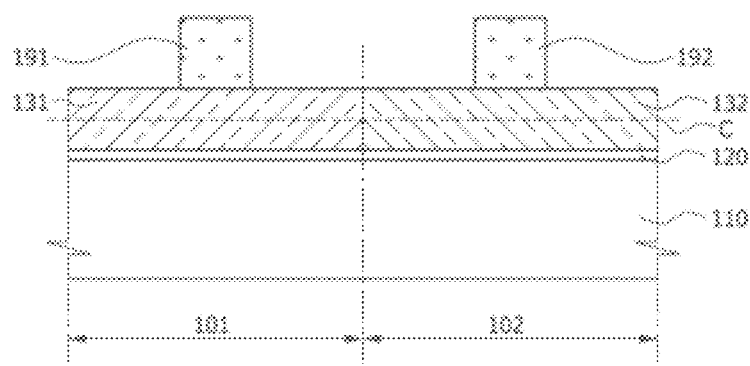
FIGS. 9 to 11 depict cross sectional views illustrating an example of processes for forming a second polysilicon pattern shown in FIG. 3.

Referring to FIG. 9, a first hard mask pattern 191 and a second hard mask pattern 192 may be formed on the first polysilicon layer 131 and the second polysilicon layer 132, respectively. The first and second hard mask patterns 191 and 192 may be formed of a silicon nitride layer, but is not limited to be a silicon nitride layer. The first and second hard mask patterns 191 and 192 may be formed by patterning a silicon nitride layer using a photolithography process and an etching process. Subsequently, the first polysilicon layer 131 and the second polysilicon layer 132 may be partially etched using the first and second hard mask patterns 191 and 192 as etch masks. For example, the first polysilicon layer 131 and the second polysilicon layer 132 may be etched by about a half of the initial thickness of the first and second polysilicon layers 131 and 132 (see a level indicated by a dotted line C in FIG. 9). Since the first polysilicon layer 131 is doped with N-type impurities and the second polysilicon layer 132 is mainly doped with P-type impurities, an etched sidewall profile of the first polysilicon layer 131 may be different from an etched sidewall profile of the second polysilicon layer 132.

Figure 10:
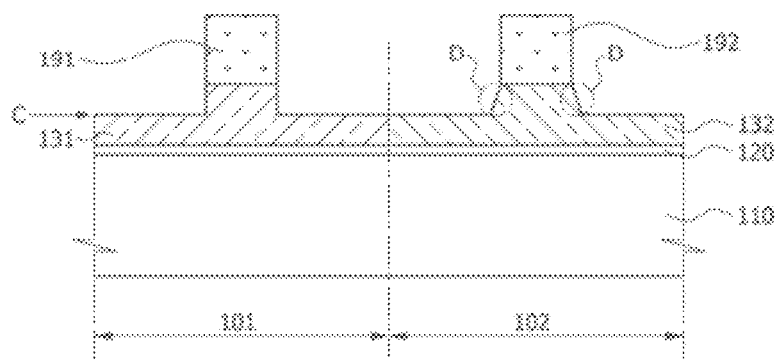
Figure 11:
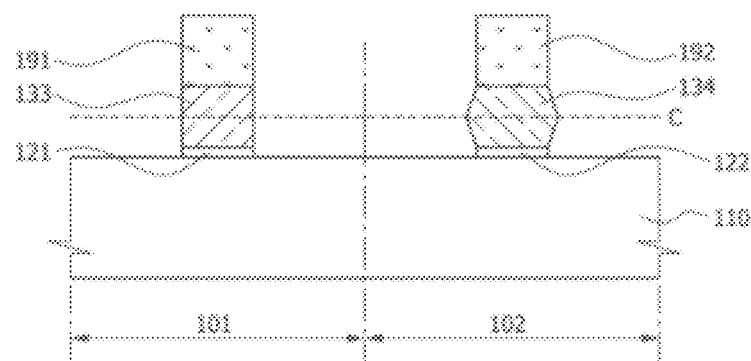

As illustrated in FIG. 10, the first polysilicon layer 131 may be partially etched to have a vertical sidewall profile whereas the second polysilicon layer 132 may be partially etched to have a positive sloped sidewall profile (see a sidewall profile indicated by D in FIG. 10). That is, a width of the partially etched second polysilicon layer 132 may gradually increase toward the substrate 110. In other words, a width of the partially etched second polysilicon layer 132 may gradually increase as the partially etched second polysilicon layer 132 gets closer to the substrate 110 (i.e., portions of the partially etched second polysilicon layer 132 that are closer to the substrate 110 may be wider than portions of the partially etched second polysilicon layer 132 that are further away from the substrate). Subsequently, as illustrated in FIG. 11, remaining portions of the first and second polysilicon layers 131 and 132 may be etched using a different etch recipe from the previous one used in the partial etching process, thereby forming an N-type polysilicon pattern 133 in the first region 101 and a P-type polysilicon pattern 134 in the second region 102. A lower portion (a portion below the dotted line C) of the P-type polysilicon pattern 134 may be formed to have a negative sloped sidewall profile, as illustrated in FIG. 11. That is, a width of the lower portion of the P-type polysilicon pattern 134 may gradually decrease toward the substrate 110. In other words, a width of the lower portion of the P-type polysilicon pattern 134 may gradually decrease as the lower portion of the P-type polysilicon pattern 134 gets closer to the substrate 110. To sum, an upper portion of the P-type polysilicon pattern 134 (a portion above the dotted line C) may increase in width nearer the dotted line C, and the lower portion of the P-type polysilicon pattern 134 may decrease in width nearer substrate 110. However, a lower portion of the N-type polysilicon pattern 133 may be formed to still have a vertical sidewall profile, as illustrated in FIG. 11. Consequently, the N-type polysilicon pattern 133 may be formed to have a substantially vertical sidewall profile in the first region 101, and the P-type polysilicon pattern 134 may be formed to have protrusions that laterally protrude from the sidewalls. The protrusions of the P-type polysilicon pattern 134 are formed to laterally extend from intermediate sidewall portions between upper sidewall portions and lower sidewall portions of the P-type polysilicon pattern 134.

Figure 4:
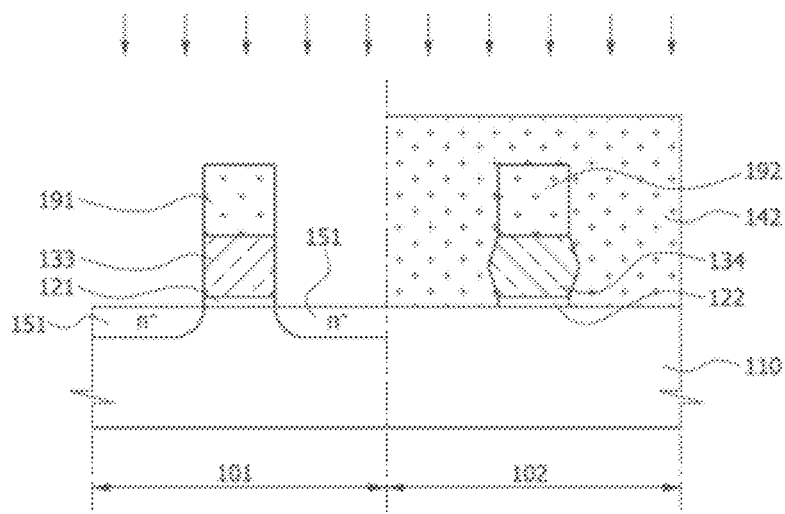

Referring to FIG. 4, a second mask pattern 142 may be formed to expose the first region 101 and to cover the second region 102. The second mask pattern 142 may be formed of a photoresist layer. As indicated by arrows in FIG. 4, N-type impurities may be then injected into the substrate 110 to form N-type lightly doped drain (LDD) regions 151 in the first region 101. While the N-type LDD regions 151 are formed, the first hard mask pattern 191 and the second mask pattern 142 may act as impurity masks. The N-type LDD regions 151 are also referred to as extended source/drain regions. After formation of the N-type LDD regions 151, the second mask pattern 142 may be removed.

Referring to FIG. 5, a third mask pattern 143 may be formed to cover the first region 101 and to leave the second region 102 exposed. The third mask pattern 143 may also be formed of a photoresist layer. As indicated by arrows in FIG. 5, P-type impurities may be injected into the substrate 110 to form P-type lightly doped drain (LDD) regions 152 in the second region 102. While the P-type LDD regions 152 are formed, the second hard mask pattern 192 and the third mask pattern 143 may act as impurity masks. The P-type LDD regions 152 are also referred to as extended source/drain regions. While the P-type LDD regions 152 are formed, a part of the P-type impurities 160 may also be injected into the protrusions (see regions B of FIG. 5). After formation of the P-type LDD regions 152, the third mask pattern 143 may be removed.

Referring to FIG. 6, the N-type impurities in the N-type LDD regions 151 and the P-type impurities in the P-type LDD regions 152 may be activated using a thermal treatment process. According to the present embodiment, the thermal treatment process may be performed after injection of the impurities for forming the LDD regions 151 and 152. However, the present embodiment is merely an example embodiment of the inventive concept. Thus, the inventive concept may not be limited to the present embodiment. For example, the thermal treatment process may be performed in another subsequent process step.

The P-type impurities 160 injected into the protrusions of the P-type polysilicon pattern 134 may be diffused toward a central region of the P-type polysilicon pattern 134 during the thermal treatment process, as indicated by arrows 165 in FIG. 6. Thus, the P-type impurity concentration in the P-type polysilicon pattern 134 may be increased. Accordingly, even though the N-type polysilicon layer (130 of FIG. 1) in the second region 102 is not sufficiently counter-doped with the P-type impurities as described with reference to FIG. 2, the P-type polysilicon pattern 134 formed in the second region 102 may be additionally doped with the P-type impurities 160. Consequently, the P-type polysilicon pattern 134 may be heavily doped with the P-type impurities at this stage, thereby improving characteristics of a PMOS transistor which is formed in the second region 102. In the event that the P-type impurities 160 are injected using a tilted ion implantation process, the P-type polysilicon pattern 134 may be more heavily doped with the P-type impurities. In an example embodiment, the thermal treatment process may be performed using a rapid thermal process (RTP) for 20 minutes or the less. The RTP may be performed using a nitrogen gas as an ambient gas. Alternatively, the RTP may be performed using a mixture of a nitrogen gas and an oxygen gas as an ambient gas.

Referring to FIG. 7, a first gate spacer 171 may be formed on sidewalls of the first gate insulation pattern 121, the N-type polysilicon pattern 133 and the first hard mask pattern 191. Similarly, a second gate spacer 172 may be formed on sidewalls of the second gate insulation pattern 122, the P-type polysilicon pattern 134 and the second hard mask pattern 192. The first and second gate spacers 171 and 172 may be simultaneously formed in the same process step. Subsequently, a fourth mask pattern 144 may be formed to expose the first region 101 and to cover the second region 102. The fourth mask pattern 144 may be formed of a photoresist layer. As indicated by arrows in FIG. 7, N-type impurities may be injected into the substrate 110 to form N-type source/drain regions 181 in the first region 101. While the N-type source/drain regions 181 are formed, the first hard mask pattern 191, the first gate spacers 171 and the fourth mask pattern 144 act as impurity masks. The N-type source/drain regions 181 may be referred to as deep source/drain regions. After formation of the N-type source/drain regions 181, the fourth mask pattern 144 may be removed.

Referring to FIG. 8, a fifth mask pattern 145 may be formed to cover the first region 101 and to leave the second region 102 exposed. The fifth mask pattern 145 may also be formed of a photoresist layer. As indicated by arrows in FIG. 8, P-type impurities may be then injected into the substrate 110 to form P-type source/drain regions 182 in the second region 102. While the P-type source/drain regions 182 are formed, the second hard mask pattern 192, the second gate spacers 172 and the fifth mask pattern 145 may act as impurity masks. The P-type source/drain regions 182 may also be referred to as deep source/drain regions. After formation of the P-type source/drain regions 182, the fifth mask pattern 145 may be removed.

According to the present embodiment, only a single mask pattern, for example, only the first mask pattern may be required to form a dual polysilicon layer. That is, only a single photo mask may be used in forming the dual polysilicon layer. Thus, fabrication costs and the number of the process steps may be reduced as compared with a typical fabrication process using two photo masks. In the present embodiment, the second to fifth mask patterns may be used in formation of typical LDD regions and typical source/drain regions. That is, the second to fifth mask patterns are not used in formation of the dual polysilicon layer. Accordingly, even though only a single mask pattern is used in formation of the dual polysilicon layer, P-type impurities may be additionally injected into a P-type polysilicon pattern used as a gate electrode of a PMOS transistor. Thus, a P-type impurity concentration in the P-type polysilicon pattern can be sufficiently increased to prevent characteristics of the PMOS transistor from being degraded.

The inventive concept may be applied to semiconductor devices employing CMOS integrated circuits, for example, dynamic random access memory (DRAM) devices and system large scaled integration (LSI) devices.

According to the example embodiments set forth above, an N-type polysilicon gate formed in an NMOS transistor region may be heavily doped with N-type impurities to obtain excellent characteristics of an NMOS transistor. Meanwhile, even though a P-type polysilicon gate formed in a PMOS transistor region is not sufficiently counter-doped with P-type impurities, the P-type polysilicon gate can be additionally doped with P-type impurities while P-type LDD regions are formed. Thus, a P-type impurity concentration in the P-type polysilicon gate can be sufficiently increased even without use of any further mask pattern. Consequently, a dual polysilicon gate layer having excellent characteristics can be formed using only a single mask pattern.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of forming a dual polysilicon gate, the method comprising:
    forming a polysilicon layer doped with impurities of a first conductivity type on a substrate having a first region and a second region;
    forming a mask pattern that covers the polysilicon layer in the first region and leaves the polysilicon layer in the second region exposed;
    injecting impurities of a second conductivity type into the polysilicon layer in the second region left exposed by the mask pattern;
    removing the mask pattern;
    patterning the polysilicon layer to form a first polysilicon pattern in the first region and a second polysilicon pattern in the second region, the second polysilicon pattern being formed to have protrusions that laterally protrude from sidewalls thereof; and
    injecting impurities of the second conductivity type into the substrate in the second region to form lightly doped regions and into the protrusions of the second polysilicon pattern to dope the protrusions with the impurities of the second conductivity type.

2. The method of claim 1, wherein the first region is an NMOS transistor region and the second region is a PMOS transistor region.

3. The method of claim 1, wherein the first conductivity type is an N-type and the second conductivity type is a P-type.

4. The method of claim 1, wherein the polysilicon layer doped with the impurities of the first conductivity type is formed by simultaneously supplying process source gases for depositing a polysilicon layer and an impurity source gas of the first conductivity type for doping the polysilicon layer into a process chamber.

5. The method of claim 1, wherein the protrusions of the second polysilicon pattern are formed to laterally extend from intermediate sidewall portions between upper sidewall portions and lower sidewall portions of the second polysilicon pattern.

6. The method of claim 5, wherein forming the second polysilicon pattern includes:
    forming a hard mask pattern on the polysilicon layer;
    partially etching the polysilicon layer using a first etching process that employs the hard mask pattern as an etch mask, thereby forming upper sidewalls having a positive sloped profile; and
    etching the remaining polysilicon layer using a second etching process different from the first etching process, thereby forming lower sidewalls having a negative sloped profile,
    wherein a width of an upper portion of the second polysilicon pattern gradually increases toward the substrate, and a width of a lower portion of the second polysilicon pattern gradually decreases toward the substrate.

7. The method of claim 1, wherein doping the protrusions with the impurities of the second conductivity type is performed using a tilted ion implantation process.

8. The method of claim 1, further comprising applying a thermal treatment process to the substrate including the lightly doped regions.

9. The method of claim 8, wherein the thermal treatment process is performed using a rapid thermal process (RTP), and the rapid thermal process is performed using a nitrogen gas as an ambient gas for 20 minutes or less.

10. The method of claim 8, wherein the thermal treatment process is performed using a rapid thermal process (RTP), and the rapid thermal process is performed using a mixture of a nitrogen gas and an oxygen gas as an ambient gas for 20 minutes or the less.

11. A method of fabricating a semiconductor device, the method comprising:
    forming a polysilicon layer doped with impurities of a first conductivity type on a substrate having a first region and a second region;
    forming a mask pattern that covers the polysilicon layer in the first region and leaves the polysilicon layer in the second region exposed;
    injecting impurities of a second conductivity type into the polysilicon layer in the second region left exposed by the mask pattern;
    removing the mask pattern;
    patterning the polysilicon layer to form a first polysilicon pattern in the first region and a second polysilicon pattern in the second region, the second polysilicon pattern being formed to have protrusions that laterally protrude from sidewalls thereof;
    injecting impurities of the first conductivity type into the substrate in the first region to form first lightly doped regions;
    injecting impurities of the second conductivity type into the substrate in the second region to form second lightly doped regions and into the protrusions of the second polysilicon pattern to dope the protrusions with the impurities of the second conductivity type;
    forming a first spacer and a second spacer on sidewalls of the first polysilicon pattern and on sidewalls of the second polysilicon pattern, respectively;
    injecting impurities of the first conductivity type into the substrate in the first region to form first source/drain regions; and
    injecting impurities of the second conductivity type into the substrate in the second region to form second source/drain regions.

12. The method of claim 11, wherein the first and second regions are an NMOS transistor region and a PMOS transistor region, respectively.

13. The method of claim 11, wherein the first conductivity type is an N-type and the second conductivity type is a P-type.

14. The method of claim 11, wherein the polysilicon layer doped with the impurities of the first conductivity type is formed using an in-situ doping process, and the in-situ doping process is performed by simultaneously supplying process source gases for depositing a polysilicon layer and supplying an impurity source gas of the first conductivity type for doping the polysilicon layer into a process chamber.

15. The method of claim 11, wherein the protrusions of the second polysilicon pattern are formed to laterally extend from intermediate sidewall portions between upper sidewall portions and lower sidewall portions of the second polysilicon pattern.

16. The method of claim 15, wherein forming the second polysilicon pattern includes:
    forming a hard mask pattern on the polysilicon layer;
    partially etching the polysilicon layer using a first etching process that employs the hard mask pattern as an etch mask, thereby forming upper sidewalls having a positive sloped profile; and etching the remaining polysilicon layer using a second etching process different from the first etching process, thereby forming lower sidewalls having a negative sloped profile, wherein a width of an upper portion of the second polysilicon pattern gradually increases as the polysilicon layer gets closer to the substrate, and a width of a lower portion of the second polysilicon pattern gradually decreases as the polysilicon layer gets closer to the substrate.

17. The method of claim 11, wherein doping the protrusions with the impurities of the second conductivity type is performed using a tilted ion implantation process.

18. The method of claim 11, further comprising applying a thermal treatment process to the substrate including the second lightly doped regions.

19. The method of claim 18, wherein the thermal treatment process is performed using a rapid thermal process (RTP), and the rapid thermal process is performed using a nitrogen gas as an ambient gas for 20 minutes or less.

20. The method of claim 18, wherein the thermal treatment process is performed using a rapid thermal process (RTP), and the rapid thermal process is performed using a mixture of a nitrogen gas and an oxygen gas as an ambient gas for 20 minutes or less.

* * * * *